(12) United States Patent
Luo et al.

(10) Patent No.: US 9,431,527 B1
(45) Date of Patent: Aug. 30, 2016

(54) ENHANCEMENT MODE HIGH ELECTRON MOBILITY TRANSISTOR

(71) Applicant: University of Electronic Science and Technology of China, Chengdu (CN)

(72) Inventors: Xiaorong Luo, Chengdu (CN); Jiayun Xiong, Chengdu (CN); Chao Yang, Chengdu (CN); Jie Wei, Chengdu (CN); Junfeng Wu, Chengdu (CN); Fu Peng, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 14/979,488

(22) Filed: Dec. 27, 2015

(30) Foreign Application Priority Data

Jul. 29, 2015 (CN) .......................... 2015 1 0456018

(51) Int. Cl.
*H01L 29/20* (2006.01)
*H01L 29/778* (2006.01)
*H01L 29/205* (2006.01)

(52) U.S. Cl.
CPC ....... *H01L 29/7784* (2013.01); *H01L 29/2003* (2013.01); *H01L 29/205* (2013.01)

(58) Field of Classification Search
CPC ........... H01L 29/7784; H01L 29/2003; H01L 29/205; H01L 29/7787; H01L 29/66462; H01L 29/402; H01L 29/475

USPC ........................................................... 257/76
See application file for complete search history.

(56) References Cited

U.S. PATENT DOCUMENTS

| 2010/0025730 A1* | 2/2010 | Heikman | H01L 29/7787 257/194 |
| 2010/0320505 A1* | 12/2010 | Okamoto | H01L 29/045 257/192 |
| 2015/0255547 A1* | 9/2015 | Yuan | H01L 29/861 257/76 |

* cited by examiner

*Primary Examiner* — Caleen Sullivan
(74) *Attorney, Agent, or Firm* — Matthias Scholl P.C.; Matthias Scholl

(57) ABSTRACT

An enhancement mode HEMT, including: a substrate layer; a buffer layer; barrier layers; drain electrodes; reverse polarization semiconductor layers; source electrodes; an insulated gate dielectric; and a metal gate electrode The buffer layer is disposed on the substrate layer, and the barrier layers are disposed on the buffer layer. Interfaces between the buffer layer and the barrier layers are provided with first heterojunctions having a two-dimensional electron gas (2DEG) channel. The drain electrodes are disposed at one end of the upper surfaces of the barrier layers and form Ohmic contact with the barrier layers. The reverse polarization semiconductor layers are disposed on the upper surfaces of the barrier layers and are able to produce inversed polarization with the barrier layers. The interfaces between reverse polarization semiconductor layers and barrier layers are provided with second heterojunctions having two-dimensional hole gas (2DHG).

13 Claims, 5 Drawing Sheets

ENHANCEMENT MODE HIGH ELECTRON MOBILITY TRANSISTOR

CROSS-REFERENCE TO RELAYED APPLICATIONS

Pursuant to 35 U.S.C. §119 and the Paris Convention Treaty, this application claims the benefit of Chinese Patent Application No. 201510456018.7 filed Jul. 29, 2015, the contents of which are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND OF THE INVENTION

1. Field of the Invention

The invention relates to an enhancement mode high electron mobility transistor (HEMT).

2. Description of the Related Art

For AlGaN/GaN HEMTs, it is well-known that enhancement mode (normally off) HEMTs are superior to depletion mode (normally open) HEMTs.

FIG. 1 shows an enhancement mode AlGaN/GaN HEMT including a P-type GaN-doped gate electrode 11. However, the doping process thereof is complex.

FIG. 2 shows an enhancement mode HEMT including a Schottky-type source electrode 61. However, the threshold voltage of the enhancement mode HEMT is difficult to control, and the produced tunneling current limits the maximum saturated output current of the HEMT.

FIG. 3 shows a field plate 12 to improve the breakdown voltage of HEMT. However, the introduction of the field plate increases the parasitic capacitance of the HEMT, which adversely affects the high frequency and switching properties thereof. For example, low concentration of fluoride ions treatment technology in the barrier layer 10 between the gate and drain is adopted. However, the fluoride ions treatment induces damage to the AlGaN/GaN heterojunction; moreover, the distribution of the fluoride ions in the thin barrier layer is difficult to control.

FIG. 4 shows a layer of GaN 13 on the barrier layer to improve the breakdown voltage of HEMT. However, when the gate voltage is large, leakage current is produced in the gate electrode, which limits the gate voltage swing.

SUMMARY OF THE INVENTION

In view of the above-described problems, it is one objective of the invention to provide an enhancement mode HEMT.

To achieve the above objective, in accordance with one embodiment of the invention, there is provided an enhancement mode HEMT. The enhancement mode HEMT comprises: a substrate layer; a buffer layer; barrier layers, each barrier layer comprising an upper surface; drain electrodes; reverse polarization semiconductor layers, each reverse polarization semiconductor layer comprising an upper surface; source electrodes, each source electrode comprising an upper surface; an insulated gate dielectric; and a metal gate electrode. The buffer layer is disposed on the substrate layer, and the barrier layers are disposed on the buffer layer. Interfaces between the buffer layer and the barrier layers are provided with first heterojunctions comprising a two-dimensional electron gas (2DEG) channel. The drain electrodes are disposed at one end of the upper surfaces of the barrier layers and form Ohmic contact with the barrier layers. The reverse polarization semiconductor layers are disposed on the upper surfaces of the barrier layers and are able to produce inversed polarization with the barrier layers. Interfaces between reverse polarization semiconductor layers and barrier layers are provided with second heterojunctions comprising two-dimensional hole gas (2DHG). The source electrodes are disposed at one end of the upper surfaces of the reverse polarization semiconductor layers away from the drain electrodes. Connecting interfaces between the source electrodes and the reverse polarization semiconductor layers are provided with potential wells. Between the drain electrodes and the reverse polarization semiconductor layers are provided with hole blocking regions. A groove comprising a bottom and side walls is disposed at one side of the source electrodes away from the drain electrodes. The bottom of the groove is disposed in the buffer layer. The insulated gate dielectric is disposed in the bottom and the side wall of the groove and extends from the upper surfaces of the source electrodes to the drain electrodes. The insulated gate dielectric is covered by the metal gate electrode, and the insulating gate structure is formed by the insulated gate dielectric and the metal gate electrode.

Specifically, the invention provides a bidirectionally polarized enhancement mode HEMT, which fully utilizes the features of the GaN-based material, including high critical breakdown electric field and high saturated electron velocity, to improve the breakdown voltage of the HEMT. Inversed polarization layers are arranged on the upper surfaces of the barrier layers between the gate electrodes and the drain electrodes, respectively. Inversed polarization is produced by inversed polarization layers and the barrier layers and the 2DHG is formed at the interfaces therebetween. In addition, the metal gate electrode is not disposed between the source electrode and the gate electrode but forms the insulating gate electrode at edges of the source electrodes away from the drain electrodes by the etched groove. In one respect, the longitudinal conductive channels between the source electrodes and the 2DEG are blocked by the corresponding 2DHG, and the electric field of the conductive channel can be controlled by exerting a voltage on the groove-type gate electrode, thereby realizing the enhancement mode and regulating the threshold voltage by doping the conductive channel. In the other respect, the polarization super junction is formed by 2DHG and 2DEG between the source electrode and the drain electrode, which is able to realize the assisted-depletion of the drift region in a blocking state, optimize the horizontal electric field of the HEMT, and improve the voltage resistant performance of the HEMT. In the meanwhile, the preparation process of the HEMT of the invention is compatible with the conventional process, thus establishing an excellent basis for the GaN power integration technology.

In a class of this embodiment, the hole blocking regions are a recess trench.

The channeling is realized by etching one part of the reverse polarization semiconductor layers that are connected to the drain electrodes to form the hole blocking regions, thus realizing physical blocking.

In a class of this embodiment, the hole blocking regions are ion implantation regions.

The ion implantation is realized by implanting a semiconductor impurity that is able to blocking the 2DHG into the reverse polarization semiconductor layers by ion implantation process.

In a class of this embodiment, the reverse polarization semiconductor layers have a step doping or linear doping profile.

In a class of this embodiment, one end of the reverse polarization semiconductor layers in the vicinity of the source electrodes are doped with a P-type semiconductor impurity.

In a class of this embodiment, the hole blocking regions are formed by implanting an N-type semiconductor impurity into the reverse polarization semiconductor layers, respectively.

In a class of this embodiment, dielectric passivation layers are disposed on the upper surfaces of the reverse polarization semiconductor layers between the source electrodes and the drain electrodes.

In a class of this embodiment, the reverse polarization semiconductor layers are made from a material selected from the group consisting of Si, SiC, GaN, AlN, AlGaN, InGaN, InAlN, and a combination thereof.

In a class of this embodiment, the buffer layer and the barrier layers are made from materials selected from the group consisting of GaN, AlN, AlGaN, InGaN, InAlN, and a combination thereof.

In a class of this embodiment, the substrate layer is made from a material selected from the group consisting of a sapphire, Si, SiC, AlN, GaN, AlGaN, and a combination thereof.

Advantages of the enhancement mode HEMT according to embodiments of the invention are summarized as follows:

1. In general, the 2DEG produced by polarization enables the AlGaN/GaN material system to have a normally-open channel, while the invention adopts inversed polarization, the highly concentrated 2DHG constitutes the potential barrier of electrons to realize a normally-off channel, which facilitates the control of the HEMT.

2. To fully utilizing the feature of high critical breakdown electric field of GaN material, the invention employs the inversed polarization layers/the barrier layers/the buffer layer to constitute a bidirectional polarization (super junction) structure, so that the 2DHG assisted depletion of the drift region is achieved in the blocking state, thereby greatly improving the breakdown voltage.

3. The gate electrode is disposed close to the source electrodes and away from the drain electrodes. Since the gate electrode is in the vicinity of the source electrodes, the gate electrode is prevented from being damaged by the high electric field, thus concentrating the effective area of the HEMT.

4. The bidirectionally polarized enhancement mode AlGaN/GaN HEMT is highly compatible.

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing an enhancement mode HEMT are described below. It should be noted that the following examples are intended to describe and not to limit the invention.

Example 1

Figure 1:
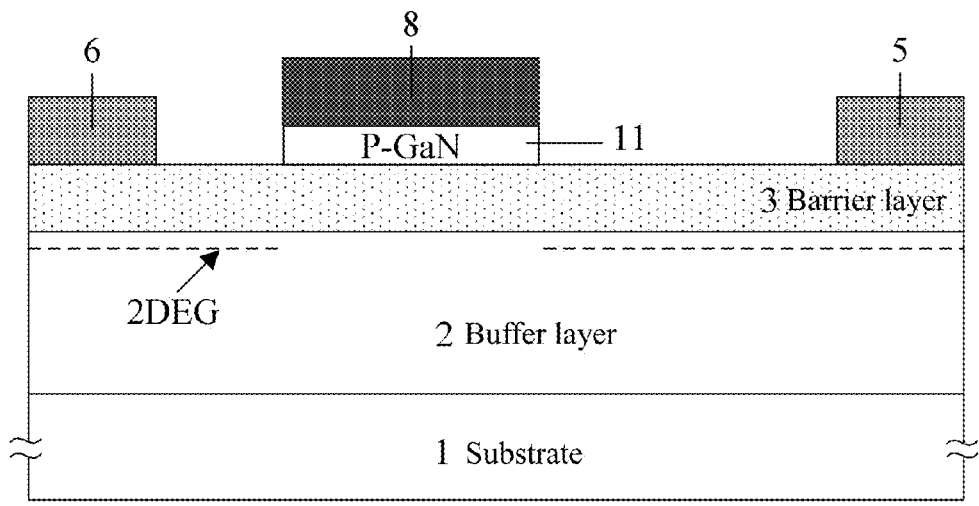
FIG. 1 is a structure diagram of an enhancement mode HEMT comprising a P-type cap layer in the prior art.
Figure 2:
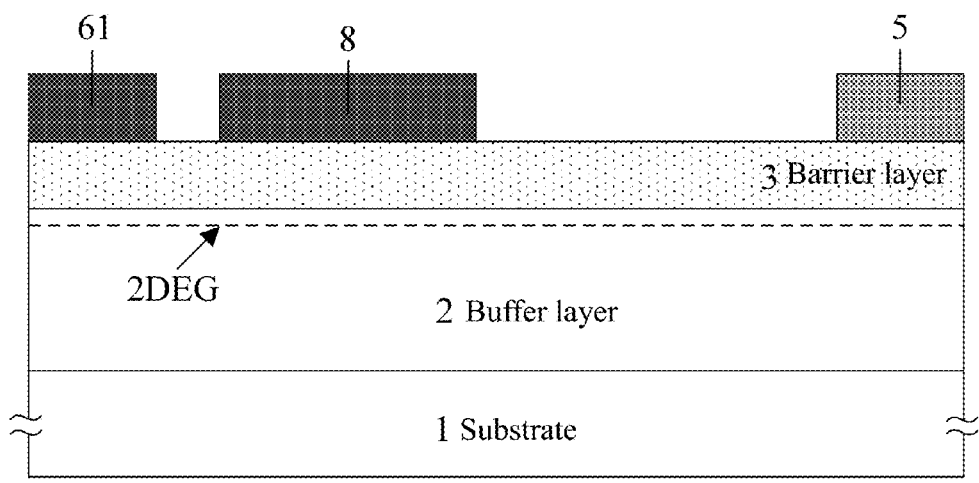
FIG. 2 is a structure diagram of an enhancement mode HEMT comprising a Schottky-type source electrode in the prior art.
Figure 3:
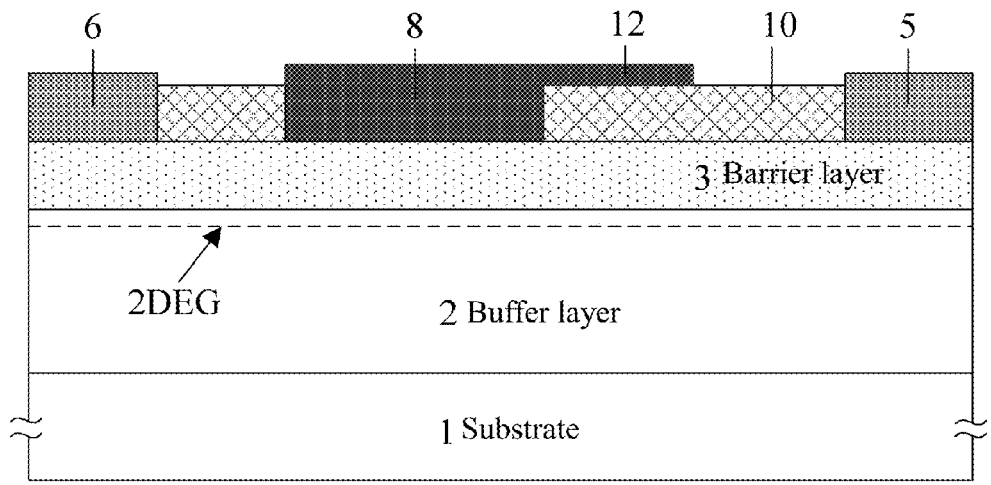
FIG. 3 is a structure diagram of an HEMT comprising a gate field plate in the prior art.
Figure 4:
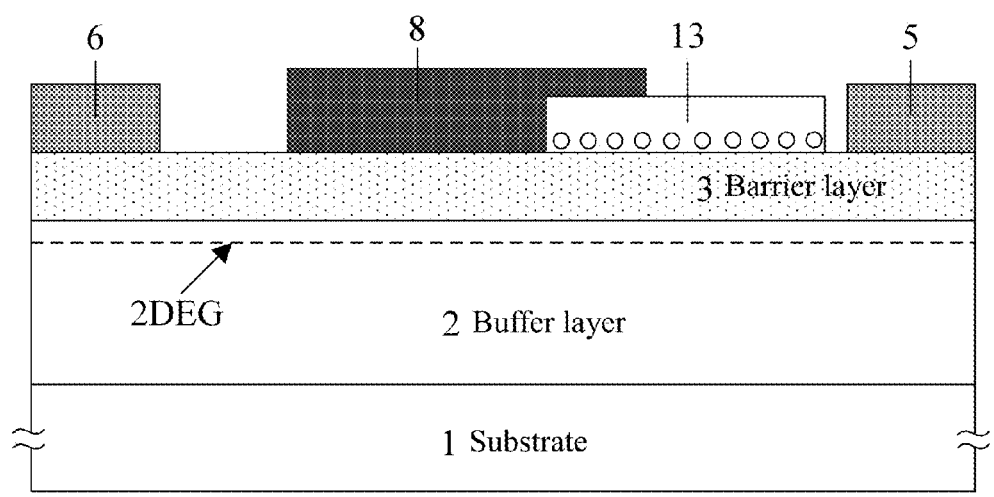
FIG. 4 is a structure diagram of an HEMT comprising a polarized super-junction electrically connected to a gate electrode in the prior art.
Figure 5:
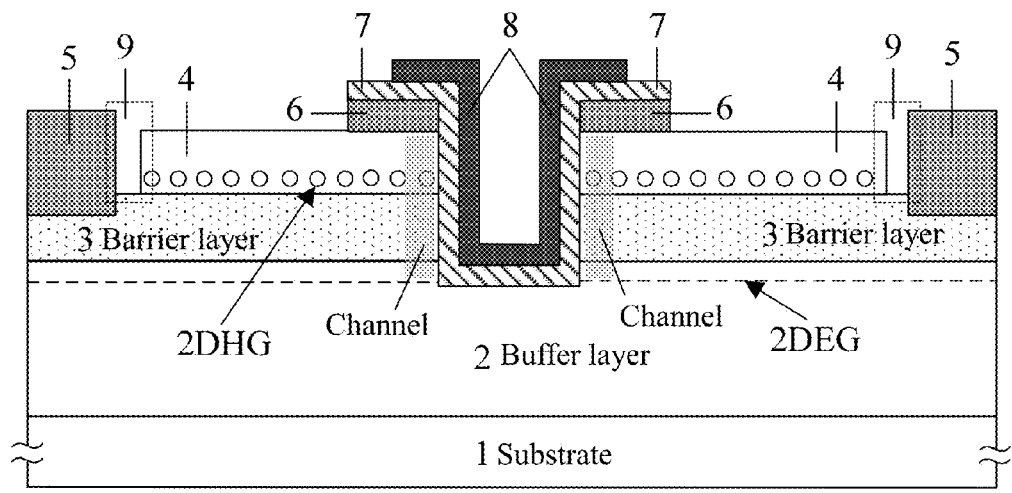
FIG. 5 is a structure diagram of an enhancement mode HEMT of Example 1.

As shown in FIG. 5, an enhancement mode HEMT comprises: a substrate layer 1, a buffer layer 2 disposed on the substrate layer 1, and barrier layers 3 disposed on the buffer layer 2. An interface between the buffer layer 2 and each barrier layer 3 is provided with a first heterojunction comprising a 2DEG channel. Drain electrodes 5 are disposed at one end of upper surfaces of the barrier layers 3 and form Ohmic contact with the barrier layers 3. Reverse polarization semiconductor layers 4 are disposed on the upper surfaces of the barrier layers 3 and are able to produce inversed polarization with the barrier layers 3. A second heterojunction comprising a 2DHG is formed at an interface between each reverse polarization semiconductor layer 4 and each barrier layer 3. Source electrodes 6 are disposed at one end of upper surfaces of the reverse polarization semiconductor layers 4 away from the drain electrodes 5. Potential wells are formed at connecting interfaces between source electrodes and the reverse polarization semiconductor layers 4, respectively. The hole blocking regions 9 are disposed between the drain electrodes 5 and the reverse polarization semiconductor layers 4, respectively. A groove is disposed at one side of the source electrodes 6 away from the drain electrodes 5. A bottom of the groove is disposed in the buffer layer 2. An insulated gate dielectric 7 is disposed in the bottom and a side wall of the groove. The insulated gate dielectric 7 is extended from upper surfaces of the source electrodes 6 to the drain electrodes 5. An insulating gate structure is formed by the insulated gate dielectric 7 and a metal gate electrode 8 covered on the insulated gate dielectric 7.

Working principle of the invention is as follows: first, the invention provides the method for realizing the enhancement mode HEMT, which adopts the inversed polarization and utilizes the highly concentrated 2DHG to produce a potential barrier of electrons so as to realize the normally-off mode channel. The longitudinal conductive channel between the source electrode and the 2DEG is conducted when the voltage of the gate electrode is increased. In addition, a polarized super junction structure is formed by the 2DHG and the 2DEG on the basis of the inversed polarization layers/the barrier layer/the buffer layer, and the 2DHG assisted depletion of the drift region is realized in the blocking state, thus, the horizontal electric field distribution of the HEMT is optimized and the voltage resistant performance is greatly improved. Finally, the gate electrodes are disposed at one side of the source electrodes away from the drain electrodes and are in the vicinity of the source electrodes, so that the gate electrodes are prevented from being damaged by the high electric field and in the meanwhile the effective area of the HEMT is reduced.

Example 2

Figure 6:
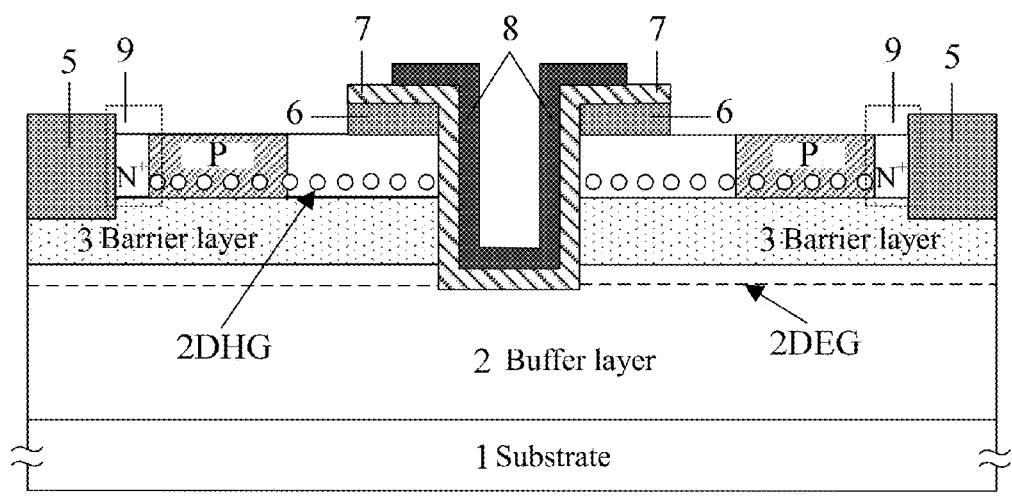
FIG. 6 is a structure diagram of an enhancement mode HEMT of Example 2.

An enhancement mode HEMT of this example adopts polarized super junction tunneling structure and the hole blocking regions formed by ion implantation. Different from Example 1, the HEMT of this example adopts highly concentrated N-type ion implantation to realize the hole blocking regions 9 between the reverse polarization semiconductor layers 4 and the drain electrodes 5, so that the formation of hole conductive channels are prevented between the source electrodes and the drain electrodes. In addition, P-type doping regions are formed in one part of the reverse polarization semiconductor layers 4 between the drain electrodes and the source electrodes, so as to prevent the electron leakage from the source electrodes to the drain electrodes. Other structures are the same as those of example 1, as shown in FIG. 6. NP junctions formed between the drain electrodes and the source electrodes also function in supporting and voltage-resistance in the blocking state. The isolation mode in the conventional HEMTs primarily includes trench isolation and ion implantation isolation, and the ion implantation isolation is easier to realize and has smaller damage on materials in relation to the trench isolation.

Example 3

Figure 7:
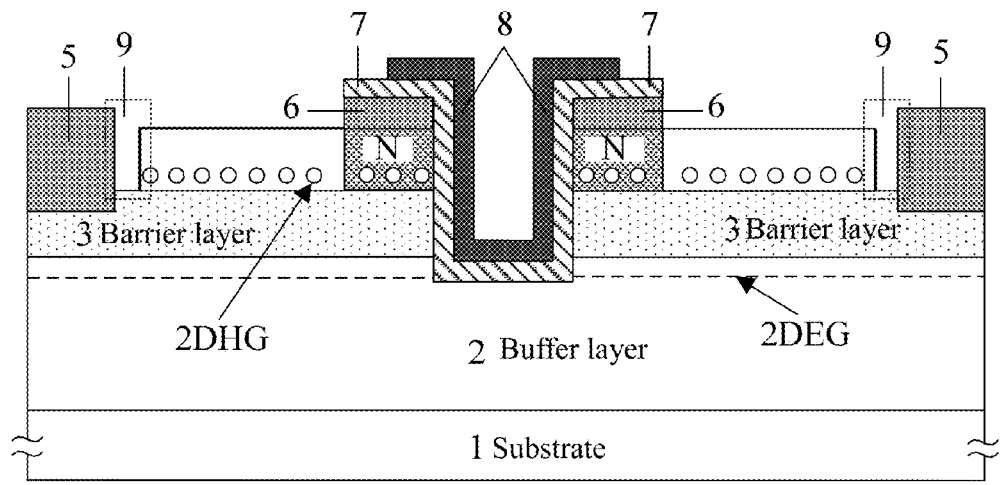
FIG. 7 is a structure diagram of an enhancement mode HEMT of Example 3.

The enhancement mode HEMT of this example adopts N-type doping in one part of the reverse polarization semiconductor layers 4 beneath the source electrodes. Compared with Example 1, one part of the reverse polarization semiconductor layers 4 beneath the corresponding source electrodes adopt the N-type doping, while other structures are the same as Example 1, as shown in FIG. 7. In one respect, the N-type doped parts beneath the source electrodes are able to form Ohmic contact between the metals of the source electrodes and the inverted polarization semiconductor layers. In the other respect, the N-type doping is able to regulate the concentration of the 2DHG so as to further regulate a threshold voltage. Other parts of the reverse polarization semiconductor layers 4 can be step doped or linearly doped, so that the horizontal electric field distribution of the drift region of the HEMT is further optimized and the voltage resistance is improved.

Example 4

Figure 8:
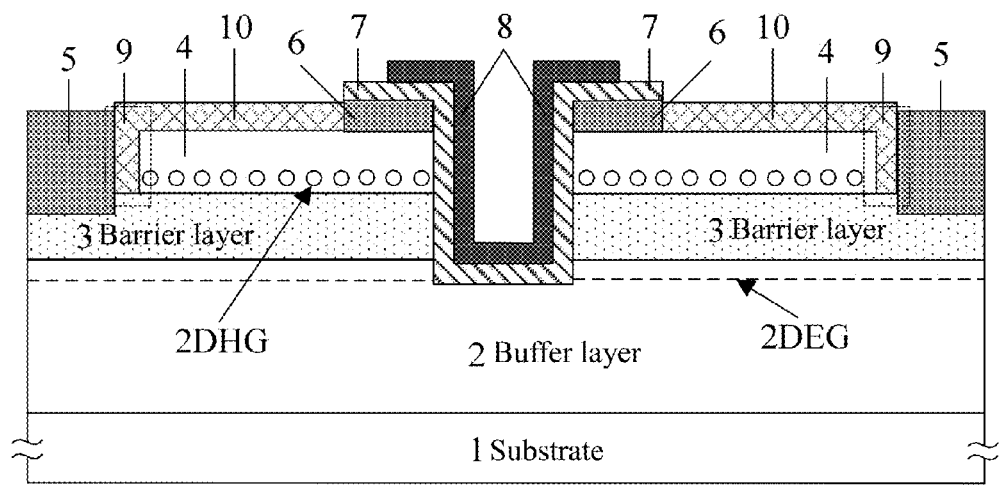
FIG. 8 is a structure diagram of an enhancement mode HEMT of Example 4.

The enhancement mode HEMT of this example adopts directional polarization and possesses dielectric passivation layers. Compared with Example 1, dielectric passivation layers are formed on the upper surfaces of the reverse polarization semiconductor layers 4 between the source electrodes and the drain electrodes, respectively, while other structures are the same as Example 1, as shown in FIG. 8. A surface state of the HEMT can be improved and the current collapse is inhibited by adopting the dielectric passivation layers. The dielectric passivation layers adopt the same material as the insulated gate dielectric, and the dielectric passivation layers and the insulated gate dielectric are formed synchronously. Or the dielectric passivation layers adopt the common dielectric materials, such as SiNx, $Al_2O_3$, and AlN.

In the bidirectionally polarized enhancement mode HEMTs described in the above examples, the substrate layer 1 is made from a material selected from the group consisting of a sapphire, Si, SiC, AlN, GaN, AlGaN, and a combination thereof. The buffer layer 2 is made from a material selected from the group consisting of GaN, AlN, AlGaN, and a combination thereof. The barrier layers 3 are made from a material selected from the group consisting of GaN, AlN, AlGaN, InGaN, InAlN, and a combination thereof. The reverse polarization semiconductor layers 4 are made from a material selected from the group consisting of Si, SiC, GaN, AlN, AlGaN, InGaN, InAlN, and a combination thereof. The source electrodes 6 and the drain electrodes 5 generally adopt metal alloys, such as Ti/Al/Ni/Au and Mo/Al/Mo/Au. The gate electrode 8 generally adopts metal alloys with relatively large work function, such as Ni/Au and Ti/Au.

Figure 9:
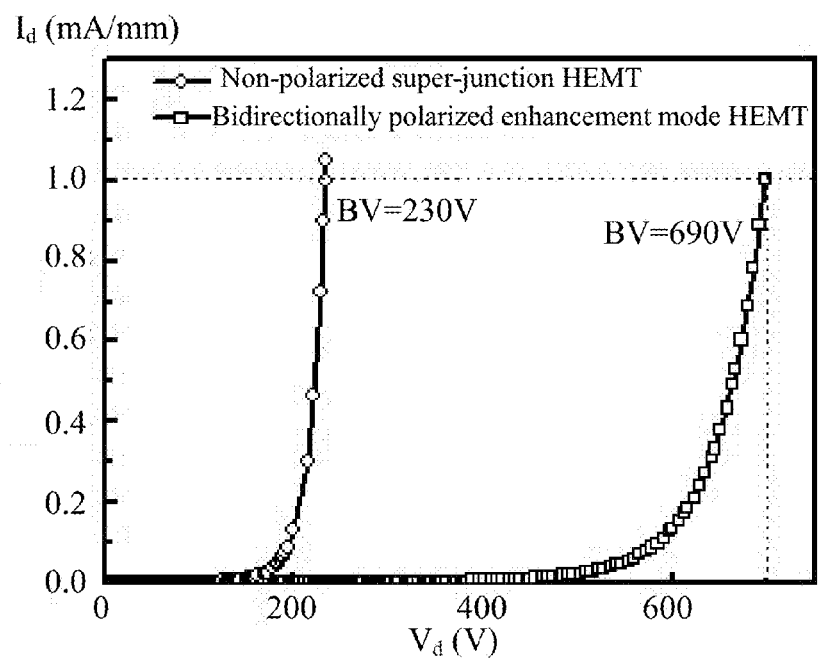
FIG. 9 is an IV curve chart of a bidirectionally polarized enhancement mode HEMT in accordance with one embodiment of the invention.
Figure 10:
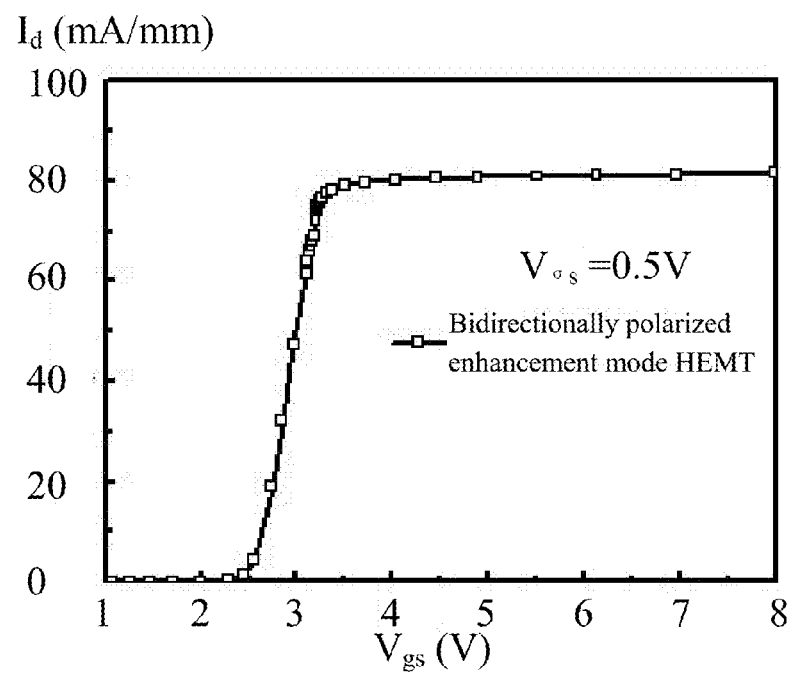
FIG. 10 is a transfer characteristic curve chart of a bidirectional polarized enhancement mode HEMT in accordance with one embodiment of the invention.

FIGS. 9-10 illustrate an IV curve chart of the directional polarized enhancement mode HEMT structure of the invention when voltage resistance is blocked and a transfer characteristic curve chart of the directional polarized enhancement mode HEMT structure of the invention during forward conductance. Software Sentaurus TCAD is employed for simulation, when a horizontal dimension of the HEMT is 7 μm and a distance between the gate electrode and each drain electrode is 5 μm, the threshold voltage of the structure provided in the invention is 2.5 V, and a breakdown voltage can reach 690 V.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:
1. An enhancement mode high electron mobility transistor, comprising:
 a) a substrate layer;
 b) a buffer layer;
 c) barrier layers, each barrier layer comprising an upper surface;
 d) drain electrodes;
 e) reverse polarization semiconductor layers, each reverse polarization semiconductor layer comprising an upper surface;
 f) source electrodes, each source electrode comprising an upper surface;
 g) an insulated gate dielectric; and
 h) a metal gate electrode;
wherein
 the buffer layer is disposed on the substrate layer, and the barrier layers are disposed on the buffer layer;
 interfaces between the buffer layer and the barrier layers are provided with first heterojunctions comprising a two-dimensional electron gas channel;
 the drain electrodes are disposed at one end of the upper surfaces of the barrier layers and form Ohmic contact with the barrier layers;
 the reverse polarization semiconductor layers are disposed on the upper surfaces of the barrier layers and are able to produce inversed polarization with the barrier layers;

interfaces between reverse polarization semiconductor layers and barrier layers are provided with second heterojunctions comprising two-dimensional hole gas;

the source electrodes are disposed at one end of the upper surfaces of the reverse polarization semiconductor layers away from the drain electrodes;

connecting interfaces between the source electrodes and the reverse polarization semiconductor layers are provided with potential wells;

between the drain electrodes and the reverse polarization semiconductor layers are provided with hole blocking regions;

a groove comprising a bottom and side walls is disposed at one side of the source electrodes away from the drain electrodes;

the bottom of the groove is disposed in the buffer layer;

the insulated gate dielectric is disposed in the bottom and the side wall of the groove and extends from the upper surfaces of the source electrodes to the drain electrodes;

the insulated gate dielectric is covered by the metal gate electrode, and the insulated gate dielectric and the metal gate electrode are combined to form an insulating gate structure.

2. The transistor of claim 1, wherein the hole blocking regions are a recess trench.

3. The transistor of claim 1, wherein the hole blocking regions are ion implantation regions.

4. The transistor of claim 1, wherein the reverse polarization semiconductor layers have a step doping or linear doping profile.

5. The transistor of claim 1, wherein one end of each reverse polarization semiconductor layer beneath the corresponding source electrode is doped with an N-type semiconductor impurity.

6. The transistor of claim 1, wherein dielectric passivation layers are disposed on the upper surfaces of the reverse polarization semiconductor layers between the source electrodes and the drain electrodes.

7. The transistor of claim 6, wherein the reverse polarization semiconductor layers are made from a material selected from the group consisting of Si, SiC, GaN, AlN, AlGaN, InGaN, InAlN, and a combination thereof.

8. The transistor of claim 7, wherein the buffer layer and the barrier layers are made from materials selected from the group consisting of GaN, AlN, AlGaN, InGaN, InAlN, and a combination thereof.

9. The transistor of claim 8, wherein the substrate layer is made from a material selected from the group consisting of a sapphire, Si, SiC, AlN, GaN, AlGaN, and a combination thereof.

10. The transistor of claim 9, wherein the hole blocking regions are a recess trench.

11. The transistor of claim 9, wherein the hole blocking regions are ion implantation regions.

12. The transistor of claim 9, wherein the reverse polarization semiconductor layers have a step doping or linear doping profile.

13. The transistor of claim 9, wherein one end of each reverse polarization semiconductor layer beneath the corresponding source electrode is doped with an N-type semiconductor impurity.

* * * * *